US00RE45034E

(19) United States
(12) Reissued Patent
Babin

(10) Patent Number: US RE45,034 E
(45) Date of Reissued Patent: Jul. 22, 2014

(54) CIRCUIT CARD INSERTION AND REMOVAL SYSTEM

(75) Inventor: Andre Babin, Chicoutimi (CA)

(73) Assignee: International Business Machines Corporation, Armonk, NY (US)

(21) Appl. No.: 12/389,096

(22) Filed: Feb. 19, 2009

Related U.S. Patent Documents

Reissue of:

(64) Patent No.: 6,411,517
Issued: Jun. 25, 2002
Appl. No.: 09/689,732
Filed: Oct. 13, 2000

U.S. Applications:

(63) Continuation of application No. PCT/CA99/00329, filed on Apr. 9, 1999.

(30) Foreign Application Priority Data

Apr. 16, 1998 (GB) ..... 9807989

(51) Int. Cl.
*H05K 5/00* (2006.01)

(52) U.S. Cl.
USPC ..... 361/759; 361/756; 361/801; 361/802; 439/259; 439/261; 211/41.17

(58) Field of Classification Search
USPC ..... 361/755–756, 759, 801–802; 211/41.17; 439/259–261
See application file for complete search history.

(56) References Cited

U.S. PATENT DOCUMENTS

| | | | | |
|---|---|---|---|---|
| 4,076,353 | A | | 2/1978 | Barlow |
| 4,445,740 | A | | 5/1984 | Wallace |
| 4,758,928 | A | | 7/1988 | Wierec et al. |
| 4,996,631 | A | | 2/1991 | Freehauf |
| 5,010,444 | A | | 4/1991 | Storrow et al. |
| 5,205,753 | A | | 4/1993 | Butterfield et al. |
| 5,238,423 | A | | 8/1993 | Hillis et al. |
| 5,317,481 | A | * | 5/1994 | Hillis et al. ..... 361/796 |
| 5,422,785 | A | | 6/1995 | Garrett et al. |
| 5,432,682 | A | | 7/1995 | Giehl et al. |
| 5,597,316 | A | | 1/1997 | David et al. |
| 5,631,808 | A | | 5/1997 | Collins, III |
| 5,644,470 | A | * | 7/1997 | Benedict et al. ..... 361/686 |
| 5,657,204 | A | | 8/1997 | Hunt |

(Continued)

FOREIGN PATENT DOCUMENTS

EP 0848320 6/1998

*Primary Examiner* — Tuan T Dinh
(74) *Attorney, Agent, or Firm* — Cynthia G. Seal; Mark E. McBurney; Thomas E. Tyson

(57) ABSTRACT

A system (22) for removably connecting a circuit card, such as an extension card (54), to an electronic device, comprises a sliding component (28) adapted to support the circuit card (54) and having a guiding edge (32) configured to be slidably inserted in a channel (26) disposed adjacent a connector (20) of the electronic device so as to position the card mating edge (56) in register with the connector (20). A lever (40) is provided for lowering the mating edge 56 of the extension card (54) until suitable connection is made between the card connector and the connector (20). Advantages of the present invention include the fact that the system allows for ergonomic insertion and removal of extension cards without the need for manual dexterity on behalf of the user.

15 Claims, 4 Drawing Sheets

(56) References Cited

U.S. PATENT DOCUMENTS

| | | | | |
|---|---|---|---|---|
| 5,675,475 | A | | 10/1997 | Mazura et al. |
| 5,751,559 | A | | 5/1998 | Jensen et al. |
| 5,815,377 | A | | 9/1998 | Lund et al. |
| 5,822,196 | A | | 10/1998 | Hastings et al. |
| 5,868,585 | A | | 2/1999 | Barthel et al. |
| 5,909,359 | A | * | 6/1999 | Summers et al. ..... 361/748 |
| 5,967,824 | A | | 10/1999 | Neal et al. |
| 5,980,281 | A | | 11/1999 | Neal et al. |
| 6,033,254 | A | | 3/2000 | Neal et al. |
| 6,071,143 | A | | 6/2000 | Barthel et al. |
| 6,115,258 | A | * | 9/2000 | Hoyle et al. ..... 211/41.17 |
| 6,406,322 | B1 | | 6/2002 | Barringer et al. |
| 6,496,385 | B1 | | 12/2002 | Smithson et al. |
| 6,816,383 | B2 | | 11/2004 | Barringer et al. |
| 7,085,137 | B2 | | 8/2006 | Smith et al. |
| 2006/0085962 | A1 | | 4/2006 | Kerrigan et al. |

* cited by examiner

CIRCUIT CARD INSERTION AND REMOVAL SYSTEM

Matter enclosed in heavy brackets [ ] appears in the original patent but forms no part of this reissue specification; matter printed in italics indicates the additions made by reissue.

RELATED APPLICATIONS

This *application is a reissue application based on U.S. Pat. No. 6,411,517, issued Jun. 25, 2002, which* is a Continuation of International PCT Application No. PCT/CA99/00329 filed on Apr. 9, 1999, which claims the benefit of GB Application No. 9807989.0.

BACKGROUND OF THE INVENTION

1. Field of the Invention

The present invention relates to the field of circuit cards and, more specifically, to a system and a method for removably connecting a circuit card to an associated substrate.

2. Description of the Prior Art

In one conventional construction of desk top computer systems and, specifically, of desk top personal computers, such personal computer includes an outer housing having a bottom wall on top of which the computer motherboard or system planar is horizontally mounted.

Within the interiors of their housings, modern personal computers are customarily provided with sheet metal cage structures adapted to receive and removably support at least one and preferably a plurality of options or extension cards which, when operatively installed in their associated cage structure upgrade the operating capabilities of the computer. These extension cards may be installed in the computer during its original manufacture and/or subsequently installed by the computer purchaser. Typical types of extension card include network, sound, graphic accelerator and multi-media cards.

An extension card is basically a relatively small rectangular printed circuit having along one side edge thereof, a connector edge portion that plugs into a corresponding socket portion of the cage structure to operatively couple the extension card to the motherboard or system planar of the computer.

Extending along one end edge portion of the extension card is a sheet metal connecting bracket having an outwardly bent securement tab portion positioned adjacent the side edge portion of the card opposite its connector edge portion. The tab portion rests upon an inturned side wall ledge of the cage structure and has notches formed therein that overlie and register with a spaced series of threaded circular openings defined in the ledge. The tab portion is removably secured to the ledge by a screw that extends through the tab notch and is threaded into its associated ledge opening. This securement of the tab portion to the cage structure ledge serves to anchor the installed extension card in place within the case structure, thereby preventing the connector edge portion thereof from being dislodged from its associated connector socket during shipping and handling of the computer.

The use of screws to removably secure the extension card to the cage structure suffers from several disadvantages. For example, during initial installation of the extension card within the cage structure one or more of the retaining screws can easily fall into the typically crowded interior of the computer, thereby creating a sometimes frustrating situation that may potentially damage the computer motherboard. Additionally, when a series of extension cards is installed at the factory, each individual connecting bracket is typically installed using an automated assembly machine. The installation of the screws is time consuming and, thus, contributes to appreciably increasing the overall assembly time for each computer in which extension cards are to be factory installed.

The use of such system also creates potential problems and inconveniences for the purchaser of the computer and/or technicians that subsequently work on the extension card portion of the computer. For example, when subsequently adding or exchanging extension cards, the technician or computer owner must unscrew the connecting bracket in place and then re-insert the removed screw into the connecting bracket on the added extension card.

Each time this task is carried out, there is the potential for dropping one or more of the individual retaining screws into the computer system. Additionally, when the computer system is being analyzed for a problem, it is often necessary to remove all of the extension cards to isolate the problem.

Thus, to install extension and so-called riser cards within the housing, it has previously been necessary to individually position each card over and separately connect each card to the motherboard using appropriate cable connectors with the extension cards in a horizontally-stacked array. In such systems, the riser card is perpendicular to the motherboard and a grounding connection for the extension riser card is also installed.

In another conventional desk top computer construction, the extension cards are individually connected in vertical orientations to the motherboard without a separate riser card. The present invention particularly relates to the second type of extension cards wherein they are connected in vertical orientation to the motherboard.

Nevertheless, whether of the horizontal or vertical type, the installation techniques required for such extension card tend to be laborious and time consuming thereby undesirably increasing the overall fabrication cost associated with the computer. As previously mentioned, they also lead to adversely affect the serviceability and upgradability of the computer since subsequent access to the motherboard requires that the extension cards be individually disconnected and removed to gain access to the motherboard portion which they overlie.

It can readily be seen from the foregoing that it would be highly advantageous from serviceability, upgradability and manufacturability standpoints to provide improved apparatus and associated methods for removably mounting operating components such as extension cards on a computer motherboard.

Typically, computer chassis designs allow the installation and removal of extension cards in the same direction as the supporting card guides are oriented. One type of chassis design which allows this is where the extension cards are plugged directly into the motherboard rather than a daughter card extending perpendicularly from the motherboard. In this type of design, a card guide that is either a separate part or integral to the chassis can be oriented to allow unimpeded insertion of a full-length extension card.

In another common chassis design, the extension cards plug into a riser card, which is fixed in the system. Once installed, the extension cards are parallel to the motherboard. An opening defined in one side of the chassis allows the extension cards to be installed and removed.

Since the riser card is fixed within the chassis, and is typically not removed in this type of design, the card guide can once again be oriented to allow unimpeded insertion of the full-length card. The drawback of this design is that typically all the extension cards must be removed individually before the user can remove the motherboard or access the area of the motherboard beneath the extension cards.

Some manufacturers have worked to improve the serviceability and accessibility of the motherboard by implementing a card cage chassis design. In such designs, the riser card is mounted within a removable card cage. Extension cards can then be installed when the card cage is either installed or removed from the system. The card guides are actually part of the card cage and therefore travel with the riser card and extension card. Once again, there is no impediment when removing from the system. Such system suffers from numerous drawbacks.

Accordingly, there exists a need for a card insertion and removal system of improved construction.

SUMMARY OF THE INVENTION

It is therefore an aim of the present invention to provide an improved circuit card insertion and removal system which is relatively simple and economical to manufacture, and wherein the circuit card may be readily installed or withdrawn from a substrate.

Therefore, in accordance with the present invention there is provided a system for removably connecting a circuit card to an electronic device, comprising a support structure for supporting the circuit card, the support structure being adapted to be slidably inserted along a first axis within the electronic device to a first position, and an actuator operational to selectively displace the circuit card along a second axis from the first position to a connection position where a connection portion of the circuit card is operatively coupled to an associated connector of the electronic device, and from said connection position to a disconnection position, wherein the connection portion of the circuit card is disengaged from the associated connector of the electronic device.

In accordance with a further general aspect of the present invention, there is provided a method of connecting a circuit card to an associated connector of a substrate, comprising the steps of: mounting the circuit card to a support structure, guiding the support structure with the circuit card mounted thereon in a first direction along a card path defined to a first position relative to said substrate, and displacing the circuit card from the first position in a second direction to a connection position, wherein the card connector of the circuit card is operatively coupled to the associated connector of the substrate.

In accordance with a further general aspect of the present invention, there is provided a support structure for a circuit card, comprising a sliding member adapted to be slidably engaged with a corresponding guiding structure of an electronic device, a mounting member movably mounted to the sliding member, the mounting member being adapted to support the circuit card, and an actuator effective for causing conjoint movement of the mounting member and the circuit card relative to the sliding member, whereby the sliding member can be slidably engaged with the corresponding guiding structure of the electronic device to direct the support structure to a first position from which the circuit card is displaced, by operation of said actuator, to a connection position where the circuit card is operatively coupled to the electronic device.

BRIEF DESCRIPTION OF THE DRAWINGS

Having thus generally described the nature of the invention, reference will now be made to the accompanying drawings, showing by way of illustration a preferred embodiment thereof and in which.

DESCRIPTION OF THE PREFERRED EMBODIMENTS

Figure 1:
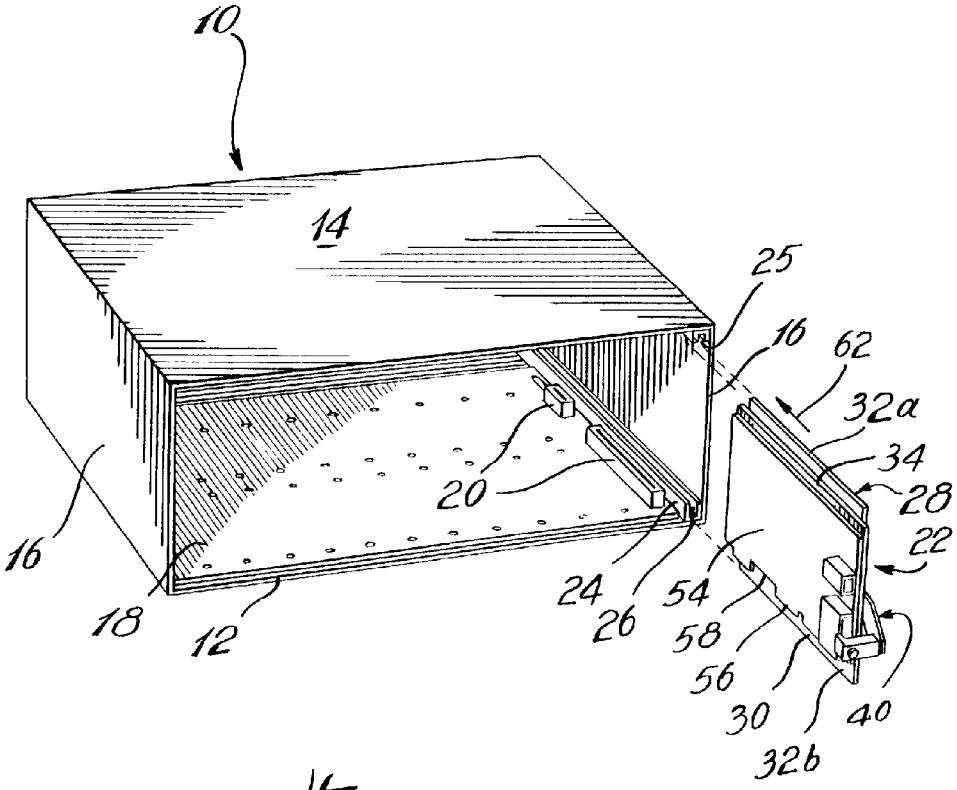
FIG. 1 is a partly exploded perspective view of a main chassis of a personal computer about to receive a circuit card mounted on a support structure of a card insertion and removal system in accordance with an embodiment of the present invention.

Referring initially to FIG. 1, there is shown in a perspective view with sections taken out a main chassis 10 such as the one typically found with conventional personal computers. The main chassis 10 has a generally rectangular configuration defining a bottom wall 12, a top wall 14 and a pair of opposed side walls 16. Removable front and back walls (not shown) may optionally be provided. It should be understood that the system in accordance with the present invention may be used with different configurations of substrates without departing from the scope of the present invention. Typically, the front wall has access slots formed therein to provide frontal access to electronic components such as floppy disk drives, hard disk drives, CD ROM drives, power switches and indicator lights as is well known in the art.

Positioned within the main chassis 10 adjacent the base wall 12 and planar with the top wall 14 is a motherboard 18 having electrical components positioned thereon.

At least one, and preferably two generally elongated circuit card connection sockets 20 project upwardly from the motherboard 18. The circuit card connection sockets 20 are generally aligned relative to each other and are electrically coupled to the motherboard 18.

Positioned within the main chassis 10 adjacent the bottom wall 12 and planar with the top wall 14 is a motherboard 18 having electrical components positioned thereon.

The guiding rail 24 is positioned adjacent the connection sockets 20 for guiding the insertion and removal movement of the sliding component 28 within the main chassis 10.

The guiding rail 24 preferably takes the form of an elongated strip of material having a generally U-shaped configuration defining a pair of guide walls and a guiding channel 26 therebetween. The guiding rail 24 is rigidly mounted to the motherboard 18 by suitable fasteners (not shown). The guiding channel 26 is preferably composed of an electrically non-conductive material such as a polymeric resin. The guiding rail 24 is preferably oriented in the direction generally parallel to that of the longitudinal axis of the connection sockets 20 although other configurations may be workable.

A second guiding channel 25 may be provided on the undersurface of the top wall 14 in parallel alignment with the first guiding rail 24.

Figure 2:
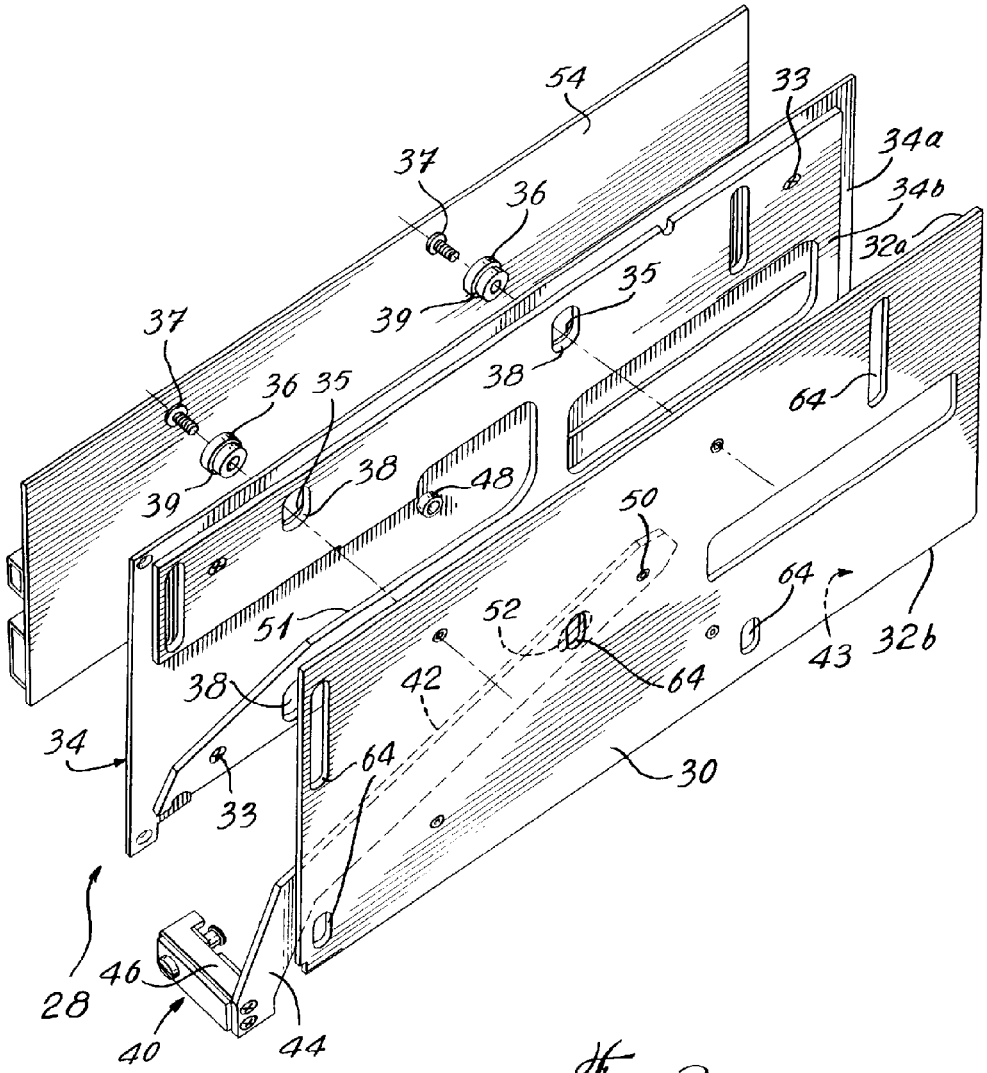
FIG. 2 is an exploded perspective view of some of the components of the card insertion and removal system.

The sliding component 28 is configured and sized so as to be slidable within the guiding channels 25 and 26. As seen in FIG. 2, the sliding component 28, in turn, includes a sliding member or base plate 30 preferably having a generally rectangular configuration and defining a pair of opposed plate guiding edges 32a and 32b adapted to be respectively engaged with the guiding channels 25 and 26. An intermediate or auxiliary component 34 acting as a mounting member for an extension card 54 is moveably mounted to the base plate 30 so as to allow movements thereof in a predetermined direction over a predetermined distance relative to the base plate 30. According to a preferred embodiment of the invention, the auxiliary component 34 can move in a direction generally perpendicular to the plate guiding edges 32a and 32b relative to the base plate 30.

As seen in FIG. 2, auxiliary component 34 is formed of a first plate 34a rigidly mounted to a second plate 34b by means of four screws 33. The first plate 34a defines four slots 35 which, once the first plate 34a has been assembled to the second plate 34b, are disposed in register with four corresponding guiding slots 38 defined in the second plate 34b. Slots 35 are larger than guiding slots 38 for purposes to be described hereinafter. Plates 34a and 34b are mounted to the base plate 30 via four retaining means or threaded fasteners 37 threadably engaged with the base plate 30 and extending through respective guide members 36 engaged in associated pair of adjacent slots 35 and 38 for sliding movements therein. Each guide member 36 is provided with an annular peripheral shoulder 39 which is received in the corresponding slot 35 and which overlies the surface of the second plate 34b surrounding the guiding slot 38 in which the guide member 36 is engaged, thereby retaining the auxiliary component 34 to the base plate 30, while allowing relative movement therebetween.

The base plate 30 may be provided with internally threaded pens 41 for receiving the threaded fasteners 37.

Figure 4:
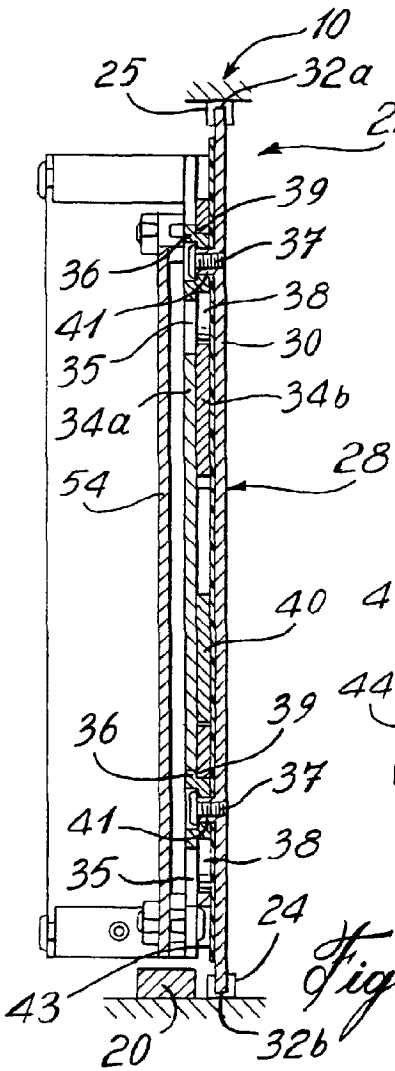
FIG. 4 is a cross-sectional view taken along line 4-4 of FIG. 3.

As seen in FIGS. 2 and 4, a sliding membrane 43 made of a material having a low coefficient of friction may be mounted by means of an adhesive coating to the mounting surface of the base plate 30 for reducing the friction between the auxiliary component 34 and the base plate 30 and, thus, facilitate relative movement therebetween.

An actuator typically in the form of an actuating lever 40 is provided for imparting linear motion to the auxiliary component 34 relative to the base plate 30. The actuating lever 40 preferably has a generally L-shaped configuration defining a lever main segment 42 and an integrally extending lever angled segment 44. A prehension segment 46 extends outwardly and substantially perpendicularly from a distal end of the angled segment 44.

Figure 3:
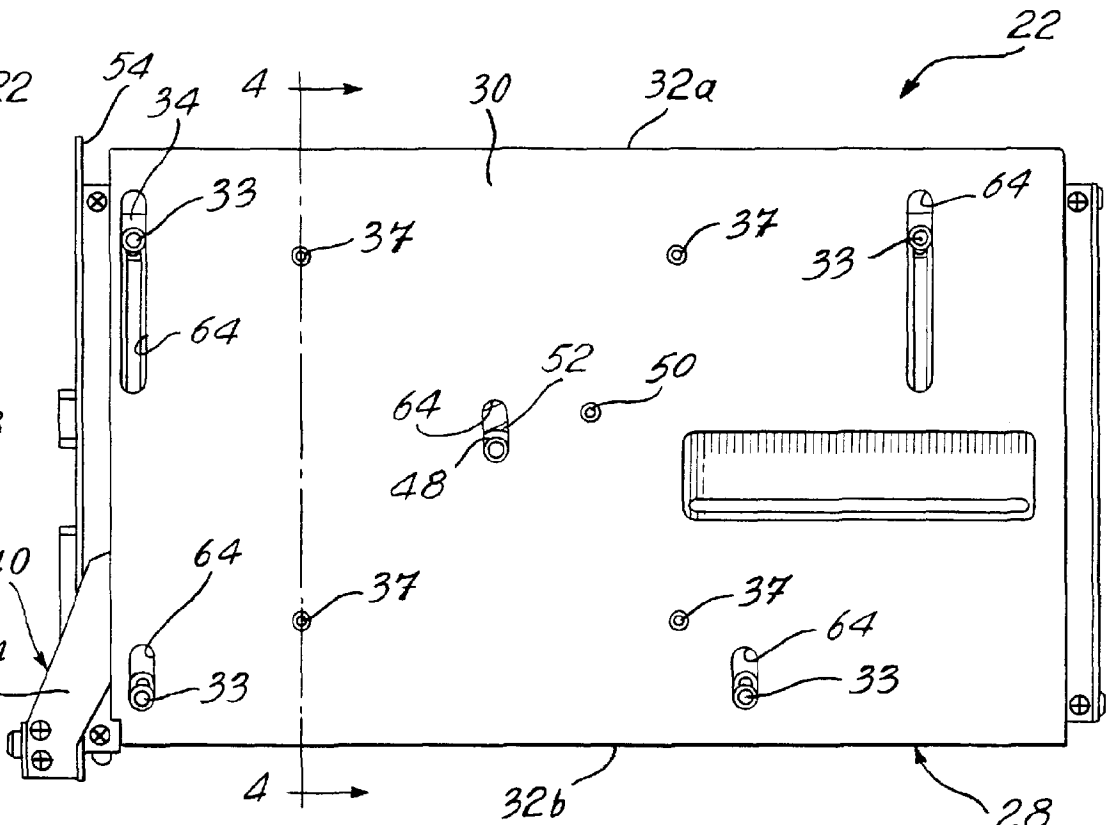
FIG. 3 is a rear plan view of the support structure on which the circuit card is mounted.

As seen in FIG. 2, the actuating lever 40 is pivotally mounted to the base plate 30 through the use of a pivot pin 50 extending at right angles from the mounting surface of the base plate 30. A cutout portion 51 is defined in the second plate 34b for allowing the pivotal movement of the actuating lever 40. The pivotal movement of the actuating lever 40 is transmitted into linear movement to the auxiliary component 34 through the use of a bearing-type component 48 mounted to the rear surface of the second plate 34b, i.e. the surface opposed to the first plate 34a, for engagement in a slot 52 defined in the actuating lever 40, as seen in FIGS. 2 to 4. According to the illustrated embodiment, the slot 52 is linear but it is understood that it could have other configurations.

The extension card 54 is rigidly mounted to the first plate 34a of the auxiliary component 34 for conjoint movement therewith. The extension card 54 has an electronic circuitry mounted thereon and is provided with a card mating edge 56 defining recesses 58 provided with pins configured and sized to be matingly and operationally engageable with the associated connector or connection sockets 20 for electronic connection therewith.

In a preferred embodiment, the auxiliary component 34 is provided with a mating edge 60 having a configuration substantially identical to that of the card mating edge 56.

As seen in FIG. 3, slots 64 are defined in the base plate 30 to provide access to the screws 33 and the bearing type component 48.

In use, as illustrated in FIG. 1, the sliding component 28 is first positioned in register and substantial alignment with the guiding channels 25 and 26 of the electronic device in which the extension card 54 has to be installed. The guiding edges 32a and 32b of the base plate 30 are slidably inserted within the channels 25 and 26 in the direction indicated by arrow 62.

Figure 5:
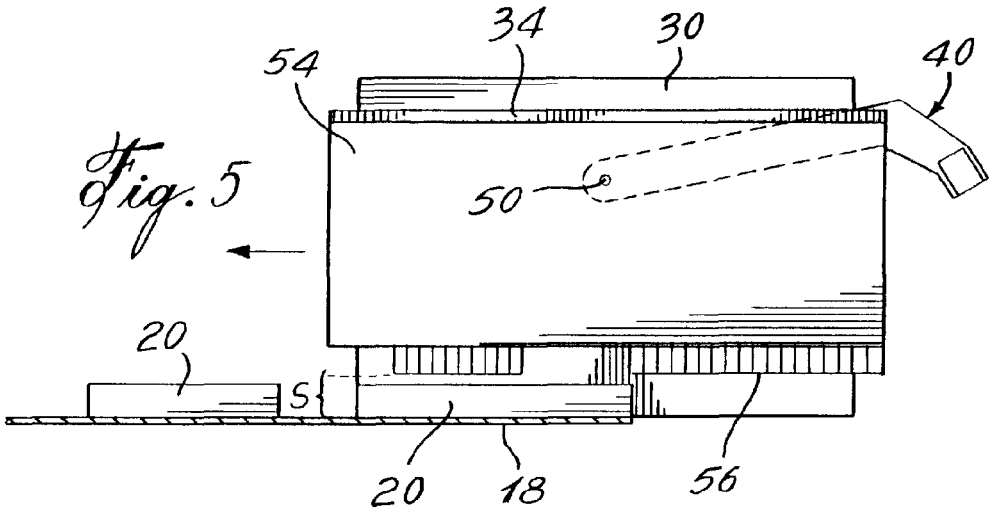
FIGS. 5 to 7 are sequential schematic side views, illustrating an operative sequence wherein the circuit card is being installed within a corresponding structure of the main chassis by means of the card insertion and removal system.

As illustrated in FIG. 5, the spacing S between the guiding edge 32 of the base plate 30 and the mating edges 60 and 56 of the auxiliary component 34 and the extension card 54 allows the latter to clear the extension card connection sockets 20 while the sliding component 28 is being slidably inserted inside the channels 25 and 26.

Figure 6:
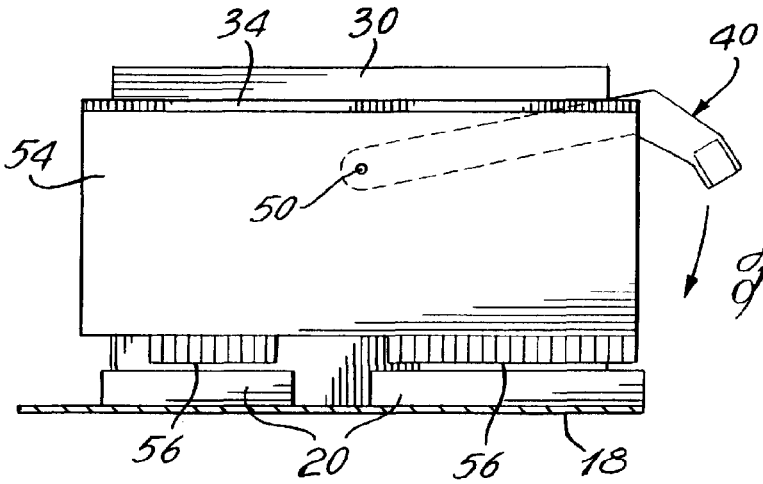
Figure 7:
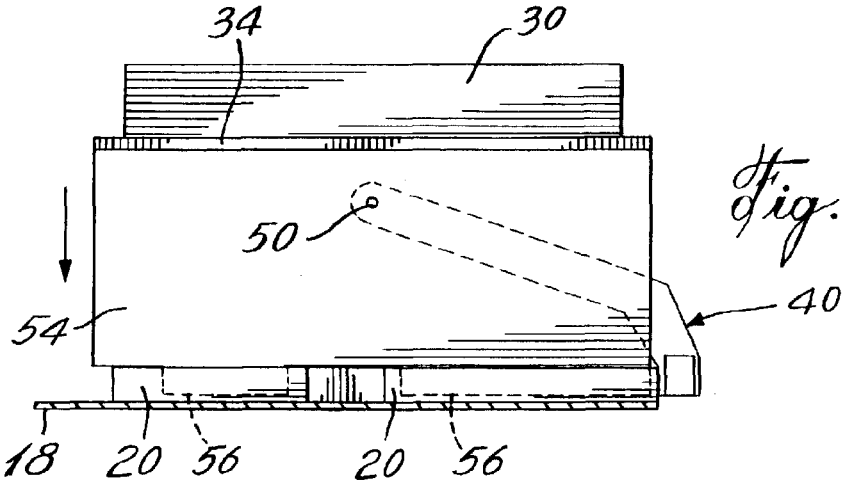

Once the sliding component 28 is fully inserted with the recesses 58 substantially in register with the connection sockets 20, as illustrated in FIG. 6, the actuating lever 40 is manually pivoted downwardly to a locked position wherein the auxiliary plate 34 is lowered until suitable connection is made between the connecting components of the extension card 54 and the extension card connection socket 20, as seen in FIG. 7. By effecting the connection of the extension card 54 with the connecting socket 20 in a direction perpendicular to the loading axis of the extension card 54, the anchoring of the extension card 54 within the chassis 10 is improved.

*Because the lever 40 is not constrained against rotation by any part of the chassis 10 it follows that he lever 40 may be actuated with the sliding component anywhere along the path of travel (in the direction of the arrow 62) of the sliding component 28 so as to displace the auxiliary plate 34 and card 54 in the direction of the downwardly located arrow as seen in FIGS. 5 to 7. In other words, the lever 40 may be rotated to displace the auxiliary plate 34 and any attached card independently of the position of the sliding component along its path of travel within chassis 10.*

The specific configuration of the lever 40 reduces the force required for proper connection. In order to remove the sliding component 28 from the chassis 10, the above-mentioned sequential steps merely need to be reversed.

An optional abutment prong (not shown) may be disposed within the chassis 10 to ensure proper positioning of the sliding component 28 therein.

Advantages of the present invention include the fact that the system allows for ergonomic insertion and removal of extension cards without the need for manual dexterity on behalf of the user. Furthermore, the present system ensures proper alignment and sound connection between the extension card 54 and the associated socket 20. Also, the system reduces the risk of damaging either the electronic device or the extension card 54 during installation or removal, and conforms to conventional forms of manufacturing so as to provide a system that is economically feasible, long-lasting and relatively trouble-free in operation. Moreover, the present system can be readily adapted to various computer configurations.

The sliding component 28 is preferably made of aluminum and acts as a shield for protecting the extension card 54.

Finally, it should be understood that although the present system has been described as being used in the field of computer and, more particularly, of personal computers, it could be used in other fields including fields wherein electronic circuitry is to be removably connected to an interface or substrate.

What is claimed is:

[1. A system for removably connecting a circuit card to a connector of an electronic device, comprising a support structure for loading said circuit card into said electronic device, said circuit card being supported by said support structure and displaceable relative thereto, said support structure being adapted to be slidably inserted along a first axis within the electronic device to a first position, and an actuator mounted to said support structure for selectively displacing the circuit card relative to the support structure along a second axis from said first position to a connection position of the circuit card where a connection portion of the circuit card is operatively coupled to the connector of the electronic device, and from said connection position to a disconnection position wherein the connection portion of the circuit card is disengaged from the connector of said electronic device, wherein said support structure includes a sliding member and an intermediate member, said intermediate member mounted between to said sliding member and said card, said intermediate member being movable relative to said sliding member, the circuit card being mounted to said intermediate member for conjoint movement therewith in response to the activation of said actuator.]

[2. A system as defined in claim 1, wherein in said first position, the connection portion of the circuit card is in register with the associated connector of the electronic device.]

[3. A system as defined in claim 2, wherein said second axis is orthogonal to said first axis.]

[4. A system as defined in claim 3, wherein said actuator is effective for displacing said circuit card in a plane which is parallel to a loading plane of said circuit card within said electronic device.]

[5. A system as defined in claim 1, wherein said intermediate member is mounted to a mounting surface of said sliding member, and wherein said intermediate member is movable relative to said sliding member in a plane parallel to said mounting surface.]

[6. A system as defined in claim 5, wherein said sliding member includes a guiding edge extending along an axis perpendicular to a direction of motion of said intermediate member relative to said sliding member.]

[7. A system as defined in claim 6, wherein slotted guides are defined in said intermediate member, and wherein retaining means are provided for mounting said intermediate member to said sliding member, said retaining means being constrained to move in said slotted guides, thereby retaining said intermediate and sliding members together while allowing relative movements therebetween.]

[8. A system as defined in claim 7, wherein said slotted guides linearly extend in a direction perpendicular to said guiding edge.]

9. A system [as defined in claim 7,] *for removably connecting a circuit card to a connector of an electronic device, comprising a support structure for loading said circuit card into said electronic device, said circuit card being supported by said support structure and displaceable relative thereto, said support structure being adapted to be slidably inserted along a first axis within the electronic device to a first position, and an actuator mounted to said support structure for rotation about an axis intersecting a major plane of said circuit card for selectively displacing the circuit card relative to the support structure along a second axis from said first position to a connection position of the circuit card where a connection portion of the circuit card is operatively coupled to the connector of the electronic device, and from said connection position to a disconnection position wherein the connection portion of the circuit card is disengaged from the connector of said electronic device, wherein said support structure includes a sliding member and an intermediate member, said intermediate member mounted to said sliding member and said card, said intermediate member being movable relative to said sliding member, the circuit card being mounted to said intermediate member for conjoint movement therewith in response to the activation of said actuator, the intermediate member being movable by said actuator independently of the position of the support assembly along said first axis wherein said intermediate member is mounted to a mounting surface of said sliding member, and wherein said intermediate member is movable relative to said sliding member in a plane parallel to said mounting surface, and wherein said sliding member includes a guiding edge extending along an axis perpendicular to a direction of motion of said intermediate member relative to said sliding member, and wherein slotted guides are defined in said intermediate member, and wherein retaining means are provided for mounting said intermediate member to said sliding member, said retaining means being constrained to move in said slotted guides, thereby retaining said intermediate and sliding members together while allowing relative movements therebetween, and* wherein a sliding membrane is disposed between said intermediate member and said sliding member.

10. A system [as defined in claim 6,] *for removably connecting a circuit card to a connector of an electronic device, comprising a support structure for loading said circuit card into said electronic device, said circuit card being supported by said support structure and displaceable relative thereto, said support structure being adapted to be slidably inserted along a first axis within the electronic device to a first position, and an actuator mounted to said support structure for rotation about an axis intersecting a major plane of said circuit card for selectively displacing the circuit card relative to the support structure along a second axis from said first position to a connection position of the circuit card where a connection portion of the circuit card is operatively coupled to the connector of the electronic device, and from said connection position to a disconnection position wherein the connection portion of the circuit card is disengaged from the connector of said electronic device, wherein said support structure includes a sliding member and an intermediate member, said intermediate member mounted to said sliding member and said card, said intermediate member being movable relative to said sliding member, the circuit card being mounted to said intermediate member for conjoint movement therewith in response to the activation of said actuator, the intermediate member being movable by said actuator independently of the position of the support assembly along said first axis, and wherein said intermediate member is mounted to a mounting surface of said sliding member, and wherein said intermediate member is movable relative to said sliding member in a plane parallel to said mounting surface, and wherein said sliding member includes a guiding edge extending along an axis perpendicular to a direction of motion of said intermediate member relative to said sliding member, and* wherein said actuator includes a lever pivotally mounted to said sliding member, said lever defining a slot configured to receive a transmission member secured to said intermediate member for imparting movement to said intermediate member relative to said sliding member in response to pivotal movement of said lever.

[11. A system as defined in claim 1, wherein said sliding and intermediate members are made in the form of plates.]

*12. A system for removably connecting a circuit card to a connector of an electronic device, comprising a support structure for loading said circuit card into said electronic device, said circuit card being supported by said support structure and displaceable relative thereto, said support structure being adapted to be slidably inserted along a first*

*axis within the electronic device to a first position, and an actuator mounted to said support structure for rotation about an axis intersecting a major plane of said circuit card for selectively displacing the circuit card relative to the support structure along a second axis from said first position to a connection position of the circuit card where a connection portion of the circuit card is operatively coupled to the connector of the electronic device, and from said connection position to a disconnection position wherein the connection portion of the circuit card is disengaged from the connector of said electronic device, wherein said support structure includes a sliding member and an intermediate member, said intermediate member mounted to said sliding member and said card, said intermediate member being movable relative to said sliding member, the circuit card being mounted to said intermediate member for conjoint movement therewith in response to the activation of said actuator, the intermediate member being movable by said actuator independently of the position of the support assembly along said first axis wherein said actuator is pivotally mounted to said sliding member and interacts with said intermediate member to cause said intermediate member and said circuit card to move together in response to the activation of the actuator.*

*13. The system as defined in claim 12, wherein the actuator is moved in a direction along said second axis.*

*14. A system as defined in claim 12, wherein in said first position, the connection portion of the circuit card is in register with an associated connector of the electronic device.*

*15. A system as defined in claim 14, wherein said second axis is orthogonal to said first axis.*

*16. A system as defined in claim 15, wherein said actuator is effective for displacing said circuit card in a plane which is parallel to a loading plane of said circuit card within said electronic device.*

*17. A system as defined in claim 12, wherein said intermediate member is mounted to a mounting surface of said sliding member, and wherein said intermediate member is movable relative to said sliding member in a plane parallel to said mounting surface.*

*18. A system as defined in claim 17, wherein said sliding member includes a guiding edge extending along an axis perpendicular to a direction of motion of said intermediate member relative to said sliding member.*

*19. A system as defined in claim 18, wherein slotted guides are defined in said intermediate member, and wherein retaining means are provided for mounting said intermediate member to said sliding member, said retaining means being constrained to move in said slotted guides, thereby retaining said intermediate and sliding members together while allowing relative movements therebetween.*

*20. A system as defined in claim 19, wherein said slotted guides linearly extend in a direction perpendicular to said guiding edge.*

*21. A system as defined in claim 19, wherein a sliding membrane is disposed between said intermediate member and said sliding member.*

*22. A system as defined in claim 19, wherein said actuator is pivotally mounted to said sliding member, said actuator defining a slot configured to receive a transmission member secured to said intermediate member for imparting movement to said intermediate member relative to said sliding member in response to pivotal movement of said lever.*

*23. A system as defined in claim 12, wherein said sliding and intermediate members are made in the form of plates.*

*24. A system as defined in claim 12, wherein said actuator is pivotally mounted to said sliding member and interacts with said intermediate member to cause said intermediate member and said circuit card to move together in response to the activation of the actuator.*

* * * * *